United States Patent [19]
Hemminger et al.

[11] Patent Number: 6,005,384
[45] Date of Patent: Dec. 21, 1999

[54] METHODS AND APPARATUS FOR OSCILLATOR COMPENSATION IN AN ELECTRICAL ENERGY METER

[75] Inventors: Rodney C. Hemminger, Raleigh; Peter Richard Rogers, Wake Forest, both of N.C.

[73] Assignee: ABB Power T&D Company Inc., Raleigh, N.C.

[21] Appl. No.: 08/735,164

[22] Filed: Oct. 22, 1996

[51] Int. Cl.[6] .................................................. G01R 11/32
[52] U.S. Cl. ............................................. 324/142; 702/61
[58] Field of Search ............................ 324/142, 74, 130, 324/132, 141; 364/483; 702/60, 61, 62

[56] References Cited

U.S. PATENT DOCUMENTS

| | | | |
|---|---|---|---|
| 4,301,508 | 11/1981 | Anderson et al. | 702/61 |
| 4,902,964 | 2/1990 | Szabela et al. | 324/74 |
| 4,987,363 | 1/1991 | Gibbs et al. | 324/142 |
| 5,216,357 | 6/1993 | Coppola et al. | 324/142 |
| 5,248,935 | 9/1993 | Sakoyama et al. | 324/142 |
| 5,548,527 | 8/1996 | Hemminger et al. | 702/62 |
| 5,555,508 | 9/1996 | Munday et al. | 702/60 |

*Primary Examiner*—Ernest F. Karlsen
*Attorney, Agent, or Firm*—Woodcock Washburn Kurtz Mackiewicz & Norris LLP

[57] ABSTRACT

Methods and apparatus for metering electrical energy are disclosed in an electronic meter which includes a first oscillator for generating a first clock signal to within a first accuracy and a second oscillator for generating a second clock signal within a second accuracy. A processor, operable in relation to a clock signal, measures time and periodically compensates for the accuracy of the first oscillator. The first clock signal is used for measuring time when power is applied to the meter and the second clock signal is used by the processor for measuring time when power has been removed from the meter. The accuracy of the first oscillator is compensated periodically in relation to a compensation factor stored in memory. In one embodiment, the processor includes a counter for counting from a first value to a second value in response to the first clock signal. In such an arrangement, the processor substitutes the first compensation factor for the first value. The meter can further include a timer, wherein the processor substitutes the first compensation factor for the first value in response to the first timer. The processor also is shown to implement a process for compensating for the accuracy of the second oscillator. This process compensates for the accuracy of the second oscillator in relation to the first oscillator. To this end, the process calculates a second compensation factor. The second compensation factor is determined when power is applied to the meter, wherein after power has been removed and restored, the second compensation factor is used to compensate time measured in relation to the second oscillator during the period power had been removed.

15 Claims, 5 Drawing Sheets

METHODS AND APPARATUS FOR OSCILLATOR COMPENSATION IN AN ELECTRICAL ENERGY METER

FIELD OF INVENTION

The present invention relates generally to the field of utility company meters for metering electrical energy. More particularly, the present invention relates to methods and apparatus for maximizing the accuracy of oscillators used in electronic watthour meters or other time sensitive devices.

BACKGROUND OF THE INVENTION

Meters for metering the various forms of electrical energy are well known. Utility company meters can be of three general types, namely, electromechanical based meters (output generated by a rotating disk), purely electronic component based meters (output component generated without any rotating parts) and a hybrid mechanical/electronic meter. In the hybrid meter, a so-called electronic register is coupled, usually optically, to a rotating disk. Pulses generated by the rotating disk, for example by light reflected from a spot painted on the disk, are utilized to generate an electronic output signal.

It will be appreciated that the use of electronic components in electric energy meters has gained considerable acceptance due to their reliability and extended ambient temperature ranges of operation. Moreover, contemporary electronic signal processing devices, such as micro controllers, have a greater accuracy potential for calculating electrical energy use than prior mechanical devices. Consequently, various forms of electronic based meters have been proposed which are virtually free of any moving parts.

Examples of electronic meters are disclosed in U.S. Pat. Nos. 5,548,527—Hemminger et al. and 5,555,508—Munday et al., incorporated herein by reference. In those meters, signal processing has been generally distributed between a digital signal processing integrated circuit device and a microcontroller device. As will be apparent, clock signal generation is necessary for the operation of such devices. Indeed, for applications in which such electronic devices are used to monitor time-based parameters, such as time-of-use metering, the accuracy of such clock signals can have a significant impact on the accuracy of the monitoring data. In metering applications, clock signals are typically generated in two ways, namely, in relation to the line frequency or through the use of an internal oscillator.

In the United States, quality clock signals can be generated in relation to line frequency, i.e., the frequency of the voltage signal being supplied to a given customer, which is 60 Hz. It is widely known that the frequency of the U.S. power grid is extremely stable over long periods of time. Internationally, the reliability of line frequency based clock signals is inconsistent, particularly in third world countries. In such environments, some other method is required for monitoring time, such as internal oscillators.

In view of the above, an electronic based energy meter will have maximum salability if it can monitor time accurately in all environments, i.e., environments in which grid frequency is stable and environments in which grid frequency is unstable. Moreover, in time-of-use meters, the measurement of real time must be maintained at all times, even during power outages. To these ends, the meters described in the above patents incorporate two crystal oscillators, one of the oscillators being used to measure real time during power outages, i.e., low power battery operation.

The accuracy of a crystal oscillator is its ability to generate a consistent signal over time. This characteristic is described in terms of PPM (parts per million). A 1 MHZ crystal which has an error of ±10 PPM will generate between 999,990 and 1,000,010 pulses every second. Since in metering applications, customer billing is based on measured time, accuracy is very important. Presently, many utility companies desire accuracies of 5 PPM.

One method for ensuring accurate crystal oscillator signals is to purchase commercially available oscillators having the desired accuracy characteristics. Unfortunately, such oscillators are relatively expensive and for high volume products such as energy meters, such expense becomes economically prohibitive. Moreover, during power outages, meters such as those described in the above patents, go into a low power mode. 32.768 kHz crystal oscillators have been used for such low power operations because they are inexpensive and well suited for low power operation. Unfortunately, the initial and long term accuracy of such crystals is commonly 50 PPM or greater. Obtaining such an oscillator with the desired accuracy specifications is also cost prohibitive.

Consequently, a need still exists for an electronic meter which incorporates accurate, low cost, crystal oscillators.

SUMMARY OF THE INVENTION

The above problems are overcome and the advantages of the invention are achieved in methods and apparatus for metering electrical energy in an electronic meter. Such meter includes a first oscillator for generating a first clock signal to within a first accuracy and a second oscillator for generating a second clock signal within a second accuracy. A processor, operable in relation to a clock signal, measures time and periodically compensates for the accuracy of the first oscillator. The first clock signal is used for measuring time when power is applied to the meter and the second clock signal is used by the processor for measuring time when power has been removed from the meter. The accuracy of the first oscillator is compensated periodically in relation to a compensation factor stored in memory. In one embodiment, the processor includes a counter for counting from a first value to a second value in response to the first clock signal. In such an arrangement, the processor substitutes the first compensation factor for the first value. The meter can further include a timer, wherein the processor substitutes the first compensation factor for the first value in response to the first timer. The processor also is shown to implement a process for compensating for the accuracy of the second oscillator. This process compensates for the accuracy of the second oscillator in relation to the first oscillator. To this end, the process calculates a second compensation factor. The second compensation factor is determined when power is applied to the meter, wherein after power has been removed and restored, the second compensation factor is used to compensate time measured in relation to the second oscillator during the period power had been removed.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION

Figure 1:
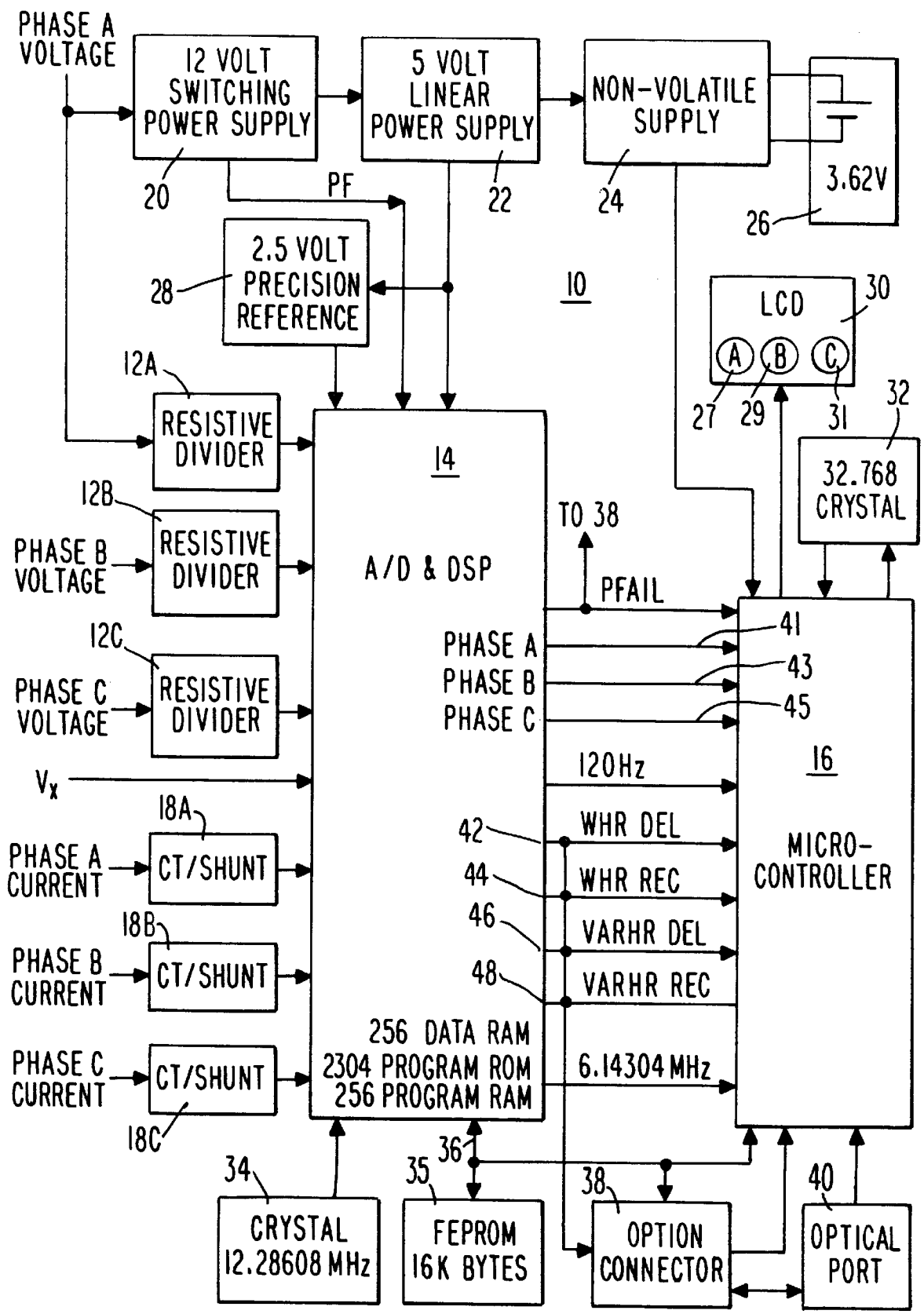
FIG. 1 is a block diagram of an electronic meter constructed in accordance with the present invention.

A new and novel meter for metering electrical energy is shown in FIG. 1 and generally designated 10. It is noted at the outset that this meter is constructed so that the future implementation of higher level metering functions can be supported.

Meter 10 is shown to include three resistive voltage divider networks 12A, 12B, 12C; a first processor 14—an ADC/DSP (analog-to-digital converter/digital signal processor) chip (hereafter DSP 14); a second processor 16—which in the preferred embodiment is a Mitsubishi Model M38207 microcontroller (hereafter MCU 16); three current sensors 18A, 18B, 18C; a 12 V switching power supply 20 that is capable of receiving inputs in the range of 96–528 V; a 5 V linear power supply 22; a non-volatile power supply 24 that switches to a battery 26 when 5 V supply 22 is inoperative; a 2.5 V precision voltage reference 28; a liquid crystal display (LCD) 30; a 32.768 kHz crystal oscillator 32; a 12.28608 MHZ crystal oscillator 34 that provides a timing signal to chip 14, which timing signal is divided by 2.0 to provide a 6.14304 MHZ clock signal to MCU 16; 16 kByte of EEPROM 35; a serial communications line 36; an option connector 38; and an optical communications port 40 that may be used to read the meter.

The 6.14304 MHZ clock signal can be used as the system clock. It is noted that a signal representative of line frequency is also provided, shown as 120 Hz in FIG. 1. In the preferred embodiment, this line frequency is representative of the line frequency of the phase A voltage. Except for certain aspects of DSP 14, MCU 16, LCD 30, crystal oscillator 32, crystal oscillator 34 and EEPROM 35, the interrelationship of all components shown in FIG. 1 is set forth in U.S. Pat. No. 5,555,508, which has been incorporated herein by reference.

During power outages, MCU 16 switches to a low power mode of operation, in which oscillator 34 or the line frequency ceases to be the source of the system clock and oscillator 32 becomes the alternate system clock. In that mode, oscillator 32 is used as the time base for determining power outage duration.

In the preferred embodiment, oscillator 34 is selected to be relatively stable, i.e., within 3 parts per million (PPM) long term. However, its actual frequency may be offset slightly from the nominal value. Oscillator 32 is selected to be less stable over time, i.e., about 50 PPM. While such an operating characteristic is poor for long term operations, it is well known that crystal oscillators of this type do exhibit good short term stability. One aspect of the invention takes advantage of this short term stability and compensates for long term instability resulting in an acceptable low cost crystal oscillator.

In the preferred embodiment of meter 10, two levels of oscillator compensation are utilized to account for long term stability. First, oscillator 34 is corrected for any deviation from its manufacturer listed value by using MCU 16 to apply a constant offset correction factor. Thus a stable time base is provided while power is ON. The offset factor for oscillator 34 can be determined during assembly by operating the oscillator, measuring its output for a period of time and comparing such output to its nominal value for that same period of time. The resulting offset value can be stored in memory 35 for later use, as will be described, by MCU 16.

Second, the corrected output of oscillator 34 is used by MCU 16 to monitor the output of oscillator 32 in real-time. Such real-time monitoring is accomplished by causing MCU 16 to calculate a correction factor, based in part on the corrected output of oscillator 34, for oscillator 32. During power outage, using battery 26, MCU 16 keeps track of time based on oscillator 32. When power is restored, MCU 16 corrects the outage time by multiplying the measured time by the last determined correction factor. This outage time is stored and is added to the time the power outage began in order to determine the current time.

Before describing in detail the compensation process, consider first the overall operation of meter 10.

METER OPERATION

It will be appreciated that electrical energy has both voltage and current characteristics. In relation to meter 10, voltage signals are provided to resistive dividers 12A–12C and current signals are induced in a current transformer (CT) and shunted. The output of CT/shunt combinations 18A–18C is used to determine electrical energy.

First, DSP 14 is connected to receive the voltage and current signals provided by dividers 12A–12C and shunts 18A–18C. As will be explained in greater detail below, DSP 14 converts the voltage and current signals to voltage and current digital signals, determines electrical energy from the voltage and current digital signals and generates an energy signal representative of the electrical energy determination. DSP 14 will always generate watthour delivered (Whr Del) and watthour received (Whr Rec) signals, and depending on the type of energy being metered, will generate either volt amp reactive hour delivered (VARhr Del)/volt amp reactive hour received (VARhr Rec) signals or volt amp hour delivered (VAhr Del)/volt amp hour received (VAhr Rec) signals. In the preferred embodiment, each transition on conductors 42–48 (each transition from logic low to logic high or vice versa) is representative of the measurement of a unit of energy. MCU 16 receives the energy signal(s) and generates an indication signal representative of the energy signal.

In relation to the preferred embodiment of meter 10, currents and voltages are sensed using conventional current transformers (CT's) and resistive voltage dividers, respectively. The appropriate multiplication is accomplished in a new integrated circuit, i.e. DSP 14. Although described in greater detail in relation to FIG. 2, DSP 14 is essentially a programmable digital signal processor (DSP) with built in analog to digital (A/D) converters. The converters are capable of sampling three input channels simultaneously at up to 14,400 Hz each with a resolution of 20 bits and then the integral DSP performs various calculations on the results.

Meter 10 can be programmed to operate as a time of use (TOU) meter. It will be recognized that TOU meters are becoming increasingly popular due to the greater differentiation by which electrical energy is billed. For example, electrical energy metered during peak hours can be billed differently than electrical energy billed during non-peak hours. As will be explained in greater detail below, DSP 14 determines units of electrical energy while MCU 16, in the TOU mode, qualifies such energy units in relation to the time such units were determined, i.e. the season as well as the time of day.

Most indicators and test features are brought out through the face of meter 10 (not shown), either on LCD 30, by elastomer switch inputs, or through optical communications port 40. In addition, other connections such as relay outputs or remote communications can be brought out through the base of the meter via option connector 38. Power supply 20 for the electronics is a switching power supply feeding low voltage linear supply 22. Such an approach allows a wide operating voltage range for meter 10.

In the preferred embodiment of the present invention, the so-called standard meter components and register electronics are all located on a single printed circuit board (not shown) defined as an electronics assembly. This electronics assembly houses power supplies 20, 22, 24 and 28, resistive dividers 12A–12C for all three phases, the shunt resistor portion of 18A–18C, oscillator 34, DSP 14, MCU 16, EEPROM 35, oscillator 32, optical port components 40, LCD 30, and an option board interface 38. Configuration and billing data is stored in EEPROM 35. This same assembly is used for TOU metering applications by merely utilizing battery 26 and reprogramming the configuration data in EEPROM 35.

Figure 2:
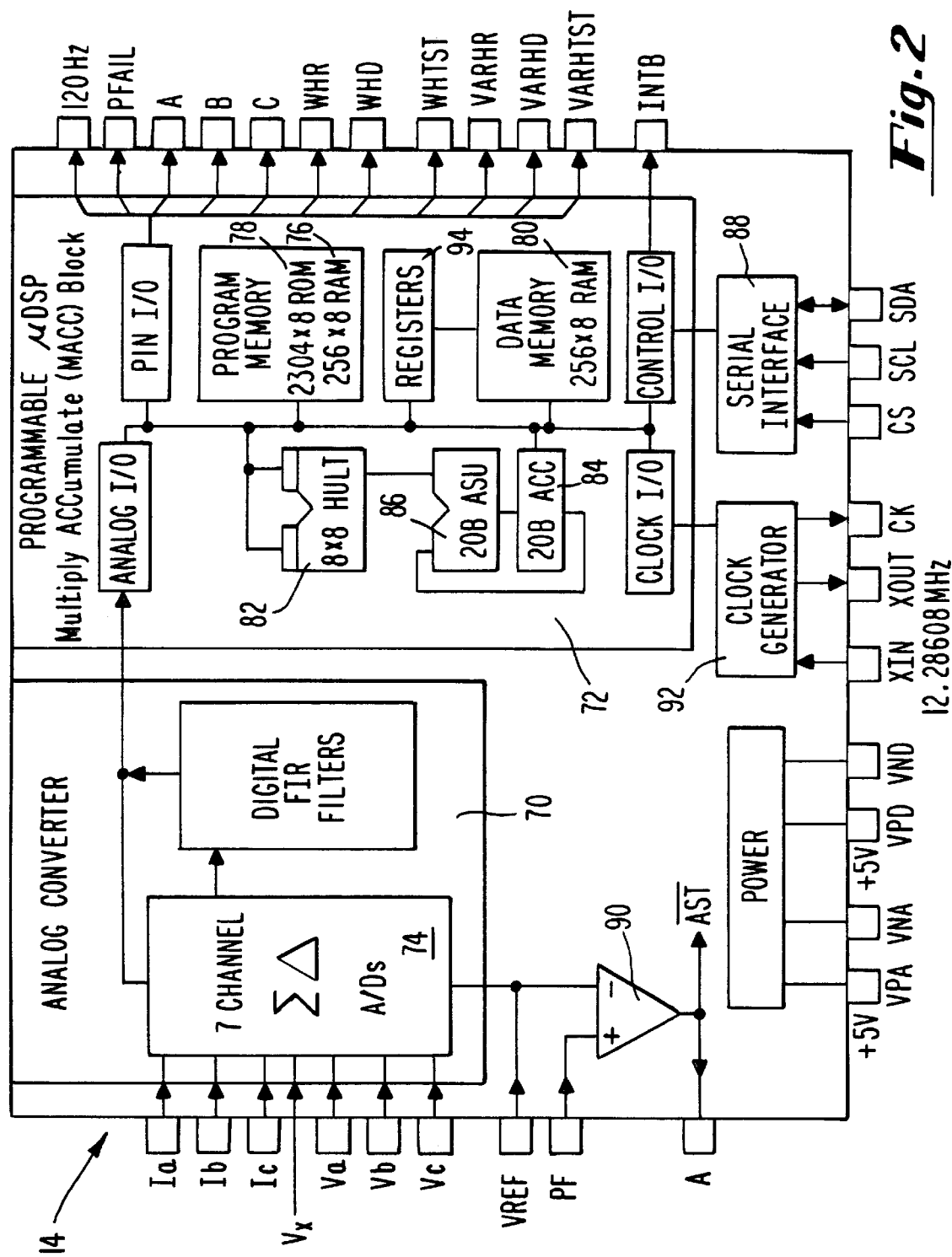
FIG. 2 is a block diagram of the A/D & DSP processor shown in FIG. 1.

It will be appreciated that energy units are calculated by DSP 14 primarily from multiplication of voltage and current. The specific formulae utilized in the preferred embodiment are listed in Table 1. As shown in FIG. 2, DSP 14 includes A/D converters 70 and a programmable DSP 72.

In the preferred embodiment, the three voltage inputs, Va, Vb and Vc are sampled by one of the A/D's and the three current inputs Ia, Ib and Ic are sampled by a second A/D. The third A/D is used to sample either Va, Vb, Vx or Ib. Such sampling of the voltage or current input at the third converter is done because for certain applications an additional signal is desired to be sampled at the same time as the voltages and currents of the other phases. As an example, so-called two element meters require the B phase voltage to be combined with the other phase voltages to produce the line-to-line voltage. Having a third A/D enables these terms to be sampled simultaneously, thereby improving the measurement accuracy. This also improves the signal to noise ratio within DSP 14.

The additional input Vx is provided as a spare channel input. One application is to use this channel to do temperature compensation by providing an input signal that is representative of temperature to the Vx input and then using the DSP to further compensate the reference voltage.

DSP 72 is a reduced instruction set (RISC) processor which computes the desired energy quantities from the converted voltage and current samples. DSP 72 is shown to incorporate a random access memory (RAM) memory 80 having a capacity of 256 bytes of data. Memory 80 is used to store computations and the subroutine stack. A read only memory (ROM) 78 is also shown and has a capacity of 2,304 bytes of data. Memory 78 is used to store those metering subroutines common to general energy calculations. Another RAM memory 76 is depicted and has a capacity of 256 bytes of data. Memory 76 is used to store the main-line program and specialized subroutines of DSP 72.

DSP 72 is also shown to include multiplier 82 and an accumulator 84 for processing the voltage and current digital signals thereby generating electrical energy information. Also included is an arithmetic subtraction unit 86 interposed between multiplier 82 and accumulator 84.

From the foregoing, it should be appreciated that program ROM, i.e. memory 78 is defined at the oxide via level. As this defining step occurs relatively late in the manufacturing process for DSP 14, changes can be made to such programming with minimal effort.

Calibration constants for each phase and certain potential linearization constants are stored in memory 80. Memories 76 and 80 are serially down loaded from EEPROM 35 by MCU 16 on power-up of meter 10. Such an embodiment allows the benefits of being able to provide various meter forms economically and to calibrate without hardware modification. It also permits the future addition of metering VAR or VA. The formulae for such operations are included in Table 1. Furthermore, the calculation of future, yet undefined, complex metering quantities could be obtained by merely reprogramming DSP 14.

DSP 14 also contains a serial interface 88, power fail detect circuitry 90, and potential present outputs A, B and C. DSP 14 is provided a clock signal by a 12.28608 MHZ crystal oscillator 34. DSP 14 uses this signal directly for driving the DSP and indirectly for the A/D sampling. This frequency is also operated upon by clock generator 92 which serves to divide the output of oscillator 34 (input to DSP 14 at XIN and XOUT) by 2.0, to buffer the divided clock signal and to output the 6.14304 MHZ clock signal at CK to MCU 16. This clock output is specified to work down to a supply voltage of 2.0 VDC.

Power fail detection circuit 90 is a comparator which compares a divided representation of the 12 V power supply voltage 20 to a precision reference. A power fail signal (PFAIL) is provided upon loss of the power supply voltage 20. Upon power fail, it is preferable to reset DSP 14. In such a situation, the output pins Whr, Whd, etc. are forced to logic low voltage levels. Additionally, DSP 14 goes into a lower power mode to reduce the current draw on power supply 22. In this lower power mode the comparator and oscillator operation are not affected, but DSP 72 ceases to operate.

The phase A, B and C potential indicator outputs are under control of DSP 14 and are generally indicative of the presence of voltage. Although not shown, it is noted that the A, B and C outputs are logic level outputs generated in response to comparing the voltage of each phase to a programmable threshold. A signal line, labeled 120 Hz in FIGS. 1 and 2, provides a frequency proportional to the received line frequency, namely, a frequency of two times the line frequency. This frequency can be used by MCU 16 in an alternate configuration to keep time based on line frequency.

OSCILLATOR OPERATION

Consider now the operation of crystal oscillators 32 and 34 and their interaction with MCU 16. It is assumed for purposes of explanation that line frequency, commonly 50 or 60 Hz, is not being used to measure time, but rather, oscillators 34 and 32 are being used for this purpose. However, it will be appreciated after reviewing the below explanation that whether the system (grid) frequency or internal oscillator 34 is being used to measure time, the oscillator compensation operations will be carried out.

During power ON operation, MCU 16 receives its 6.14304 MHZ clock input from DSP 14 as described above. This signal is divided by sixteen (16) and the resultant signal (383,940 Hz) is used to drive a first timer, TIMER X (designated as 132 in FIG. 4). This first timer is used to keep time during power ON operation. Upon the occurrence of a power fail, MCU 16 shifts to the 32.768 kHz crystal oscillator 32 for tracking time in a low power mode. To this end, a WIT instruction is executed which places MCU 16 in a mode where only the 32.768 kHz oscillator and associated timers are operational. While in this mode a timer is set to "wake up" MCU 16 every 32,768 cycles of oscillator 32 to count a second.

It will be appreciated from the following description that the control of various timers, the capture of various timer values and the calculation of oscillator compensation are preferrably achieved in software implemented in MCU 16. The invention is not limited to that particular implementation. However, for purposes of explanation it will be so described. Consider first the flow chart shown in FIG. 3.

In order to compensate for oscillator instability, MCU 16 first initializes certain functions at 100. The need for initialization occurs when MCU 16 goes into reset, which is the case when the voltage from non-volatile supply 24 falls below approximately 2.5 volts. Otherwise, MCU 16 performs operations to restore from a power outage, which occurs at 102.

During initialization, MCU 16 will initialize or set certain parameters so that oscillator compensation can begin. Oscillator 32 is corrected by dynamically calculating a correction factor (hereafter CF32) during power ON operation and then modifying the outage duration time measurement made in relation to oscillator 32 during power OFF operation by CF32. To this end, CF32 will be some numerical value between zero and 2.0. During initialization CF32 is set to 1.0, its nominal value when oscillator 32 is exactly correct.

As will be explained in greater detail in relation to FIGS. 4 and 5, CF32 is calculated in relation to the measurements made by various timers, namely TIMER X (designated 132 in FIG. 4) and TIMER Y (designated 150 in FIG. 4) and seconds counter NUMSEC32 (designated 154 in FIG. 4). In the preferred embodiment, TIMER X and TIMER Y are MCU hardware timers, each of which are set with a value from which they count down to zero in response to a clock signal. During initialization, TIMER X and TIMER Y are provided with default values. In the preferred embodiment, TIMER X is set to 2,999 and TIMER Y is set to 32,768. The significance of these values is described below in relation to FIG. 4. NUMSEC32 is a software timer.

Normally, MCU 16 will be operating in a main loop routine where power is ON and meter 10 is measuring and recording electrical energy consumption or generation. However, occasionally power will be removed, for example during a power outage. When power is restored, MCU 16 only performs the initialization routine if it lost battery carryover and went into reset, as described above. Otherwise, MCU 16 performs operations to restore from the power outage, which occurs at 102.

It will be recalled from above, that MCU 16 compensates for the stability limitations of oscillator 32 by calculating CF32. This calculation is achieved using the values X0, X1, Y1 and SAVSEC32, where X0 is the count of TIMER X at the beginning of the current interval, X1 is the count of TIMER X at the end of the current interval, Y1 is the count of TIMER Y for the current interval and SAVSEC32 is the count of the number of seconds at the end of the current interval counted in NUMSEC32 in response to the operation of oscillator 32. All of these operations are explained in greater detail in relation to FIG. 4. In addition, MCU 16 compensates oscillator 34 and calculates CF32 after the conclusion of certain time intervals. These intervals are determined by timers called for discussion purposes COMP12 and COMP32 (designated 142 and 144, respectively, in FIG. 4). These timers count up from zero to some interval value. During restore, COMP12 and COMP32 are initialized.

As will be described in relation to FIG. 4, it will be seen that the COMP12 timer is set to 10 seconds and COMP32 timer is set to 20 seconds. However, it is desirable for COMP32 and COMP12 timers to not finish their respective intervals at the same time, which can happen since the desired values are multiples of each other. Consequently, during restore 102, the interval values are initially set so the COMP32 interval starts first, the COMP12 interval starts 5 seconds later. 10 seconds later the COMP12 interval ends and oscillator 34 is compensated. 5 seconds after that COMP32 interval ends and CF32 is calculated.

Figure 3:
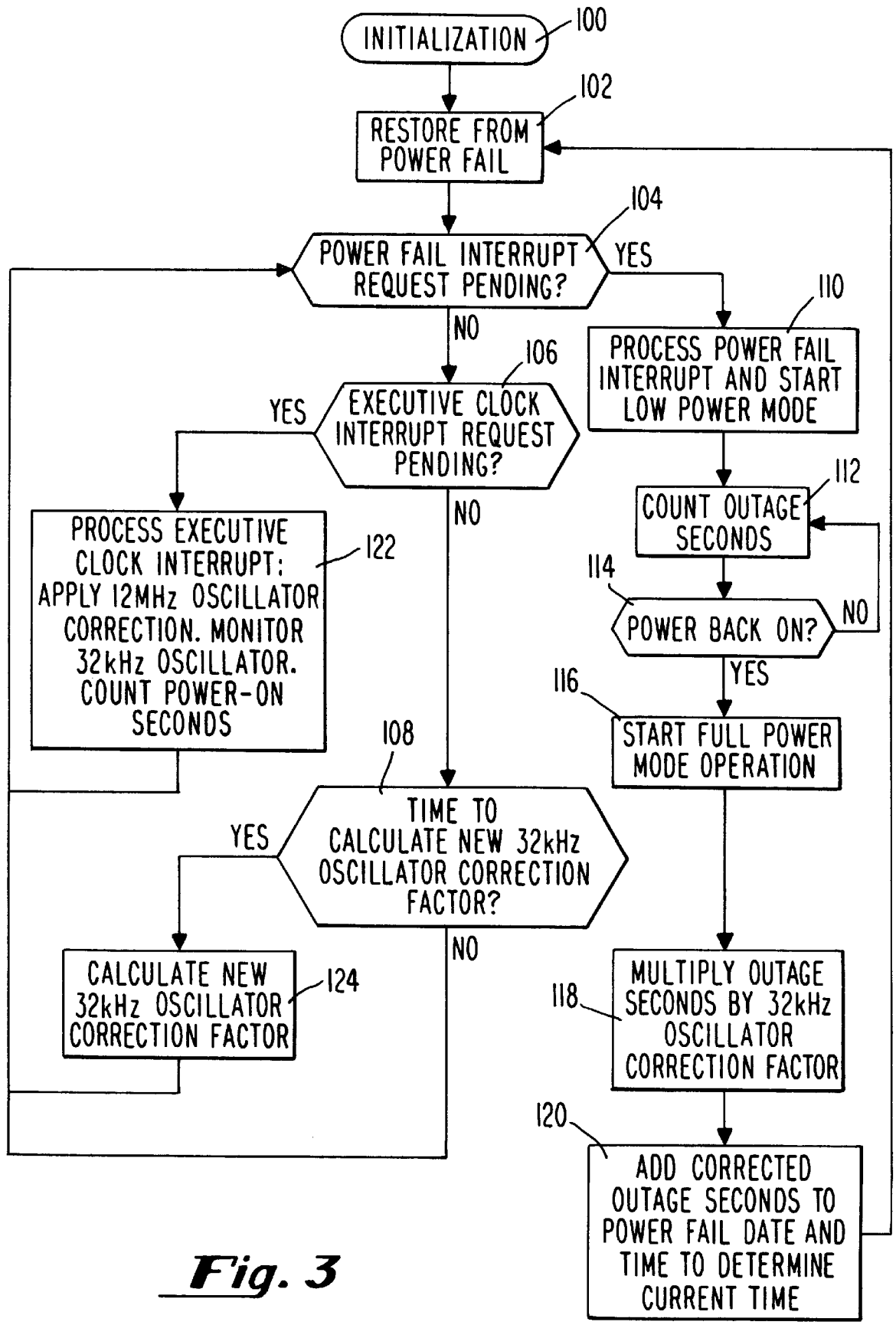
FIG. 3 is a flow chart of programming implemented in the microcontroller disclosed in FIG. 1.

After restore 102, MCU 16 enters into a main loop program, three steps of which are shown in FIG. 3. It will be appreciated that the main loop program contains many items other than what is shown in FIG. 3, however, the steps shown in FIG. 3 are necessary to achieve the desired oscillator compensation. The three steps include, reacting to a power fail interrupt, at 104, reacting to an executive clock interrupt, at 106, and calculating a new CF32, determined at 108.

The determination of a power fail interrupt at 104 is indicative that a power failure has been detected and that power is about to be lost. Such an interrupt will be generated in response to the detection of an appropriate signal on the PFAIL output from DSP 14. In such a situation MCU 16 will begin at 110 to process the power fail interrupt and begin the low power mode. It will be recalled that, during low power mode, MCU 16 will "sleep" and "wake-up" in relation to oscillator 32. As shown in FIG. 4, MCU 16 via TIMER Y, counts a second at 112 and determines at 114 whether power has come back on. If power has not been restored, MCU 16 returns to 112 to count another second when TIMER Y reaches the appropriate count. When power is restored, MCU 16 starts full power operation at 116. The number of seconds counted during the power outage is modified, i.e., multiplied, at 118 by the last calculated CF32 before power was lost. This compensated value, in addition to being recorded as the outage duration, is added to the last known date and time at 120 in order to establish also the current date and time. MCU 16 then returns to the restore operations at 102.

If no power fail interrupt is pending at 104, MCU 16 next determines the presence of an executive clock interrupt request at 106. If such a request is present, MCU 16 processes the interrupt at 122; executive clock interrupt operations include determining whether it is time to compensate for oscillator 34, monitoring oscillator 32 and counting power ON seconds. Although these operations will now be generally described, they are more particularly described in relation to FIG. 5. As will be described in FIG. 4, the executive clock interrupt occurs whenever TIMER X counts 1/128 of a second, i.e., every 7.8125 ms.

At 122, MCU 16 determines whether the correction factor necessary to compensate oscillator 34 (hereafter CF12) was loaded into TIMER X. TIMER X is preferably a countdown timer which over a period of 10 seconds will count from a specified default reload value (hereafter DEFAULT12, designated 134 in FIG. 4) generally representative of a 1/128 second interval for a clock signal originating from oscillator 34 and at this point having a frequency of 383,940 Hz (preferably DEFAULT12 is 2,999) down to zero 1,279 times. The 1280th operation of TIMER X will involve the timer counting down to zero from the compensation value determined during manufacture, i.e., CF12 (designated 136 in FIG. 4). In the preferred embodiment, CF12 is determined by measuring the actual frequency of oscillator 34 and applying the following formula:

CF12=((measured frequency−6,143,040 Hz)/1.6 Hz)+2999+680 value rounded to nearest integer

If MCU 16 determines at 122 that TIMER X just counted down from CF12 to zero, it reloads TIMER X with DEFAULT12, i.e., the 2999 value. In the preferred embodiment, if the memory area where CF12 is stored appears corrupt, for whatever reason, MCU 16 will use a nominal compensation value (preferably 2999+680). If it is determined that TIMER X just counted from CF12, MCU 16 also resets the flag which signals that compensation of oscillator 34 was just performed.

At 122, MCU 16 also maintains the seconds count from TIMER Y. It will be recalled that TIMER Y is driven by oscillator 32 which operates at 32.768 kHz and that TIMER Y counts down to zero preferably from the value 32,768 (hereafter COUNT32, designated 152 in FIG. 4). Consequently, every time TIMER Y reaches zero, 1 second will have passed, if oscillator 32 is stable. Preferably, TIMER Y is automatically loaded with COUNT32, via a reload register, each time TIMER Y reaches zero and a flag is set indicating that TIMER Y reached zero. Consequently, at 122 MCU 16 looks to see if the TIMER Y reload flag is set. If it is, MCU 16 counts 1 second in NUMSEC32 (count of oscillator 32 based seconds) and resets the reload flag.

At 122, it is also desirable to count each second determined by TIMER X. It will be recalled that TIMER X is counting down to zero in roughly 1/128th of a second increments. Accordingly, a counter (hereafter SECCNTR, designated 138 in FIG. 4) is provided which counts down from 128 each time TIMER X reaches zero. When SECCNTR reaches zero, it provides a signal indicative of the passage of 1 second of time (used for power ON timekeeping). The executive clock interrupt (designated 140 in FIG. 4) is driven by this counter. When it is determined that a second has passed, a number of boundary routines are performed.

First a check is made to determine if the time has been reached to correct oscillator 34. To this end, COMP12 counts up from zero to 10 seconds at each second indication from SECCNTR. When COMP12 reaches 10 seconds, MCU 16 causes CF12 to be loaded into TIMER X. COMP12 will then begin again to count up from zero to 10 seconds.

Another boundary routine is to determine whether the time has come to compensate oscillator 32, i.e., calculate a new CF32. Similar to determining if the COMP12 time period has passed, MCU 16 uses COMP32 timer which counts up from zero to 20 seconds each time an indication is given by SECCNTR that a second has passed. Once MCU 16 determines that 20 seconds have passed, it calculates a new CF32 at 124. COMP32 then begins again to count up from zero to 20 seconds.

Figure 4:
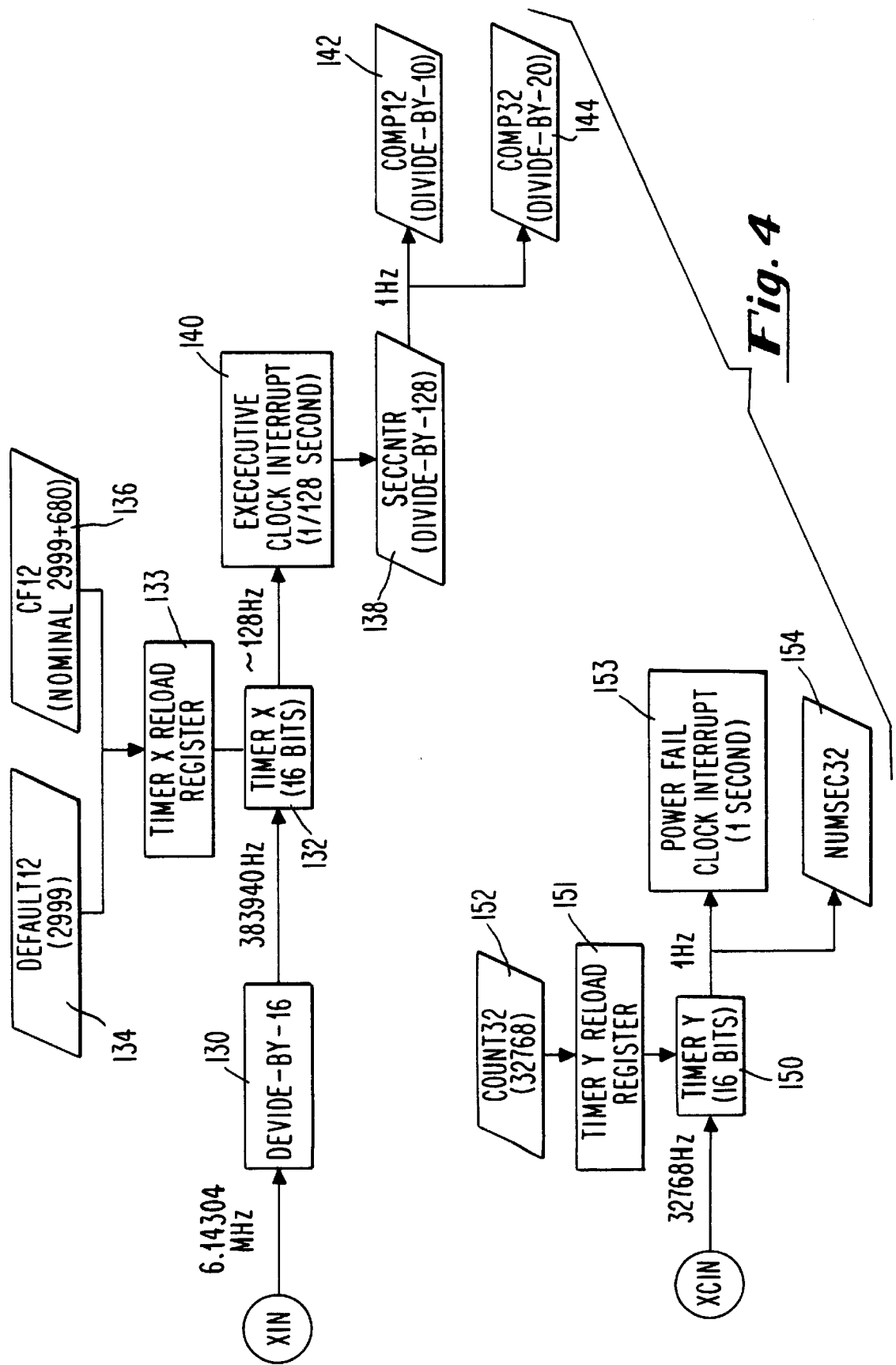
FIG. 4 is a block diagram of timers, software counters and programming implemented in the microcontroller disclosed in FIG. 1.

Before describing the process performed at 122 and 124, to calculate a new CF32, consider the flow of data as shown in FIG. 4. In FIG. 4, the 6.14304 MHZ clock signal is received from DSP 14 and divided by 16 by divider 130. The resulting 383,940 Hz clock signal is provided to TIMER X (132). TIMER X counts down, 1,279 times during a 10 second interval, from a default value DEFAULT12 (134) to zero loaded from reload register 133. On the 1,280th time, register 133 is loaded with offset value CF12 (136).

When timer 132 reaches zero, a clock signal is provided to SECCNTR (138) which determines the passage of a second. To make this determination, SECCNTR 138 is loaded with a count value, preferably 128. SECCNTR 138 will count down to zero. When SECCNTR 138 reaches zero, a clock signal is provided. This clock signal is approximately 1 Hz and is indicative of the passage of 1 second of time. The clock signal from SECCNTR 138 is provided to timers COMP12 (142) and COMP32 (144). COMP12 counts up from zero to 10 seconds. When COMP12 reaches 10 seconds, a flag is set indicating that it is time to again compensate oscillator 34. COMP32 (144) counts up from zero to 20 seconds. When COMP32 reaches 20 seconds, a flag is set indicating it is again time to calculate a new compensation value CF32 for oscillator 32.

While TIMER X (132) is counting, the clock signal generated by oscillator 32 is provided to TIMER Y (150). TIMER Y is loaded, via load register 151, with a default value COUNT32 (152). TIMER Y (150) counts down from the loaded default value to zero in response to the signal from oscillator 32. Each time TIMER Y (150) reaches zero, it provides a clock signal (ideally 1 second) to counter NUMSEC32 (154). NUMSEC32 (154) counts the number of times TIMER Y (150) reaches zero.

Figure 5:
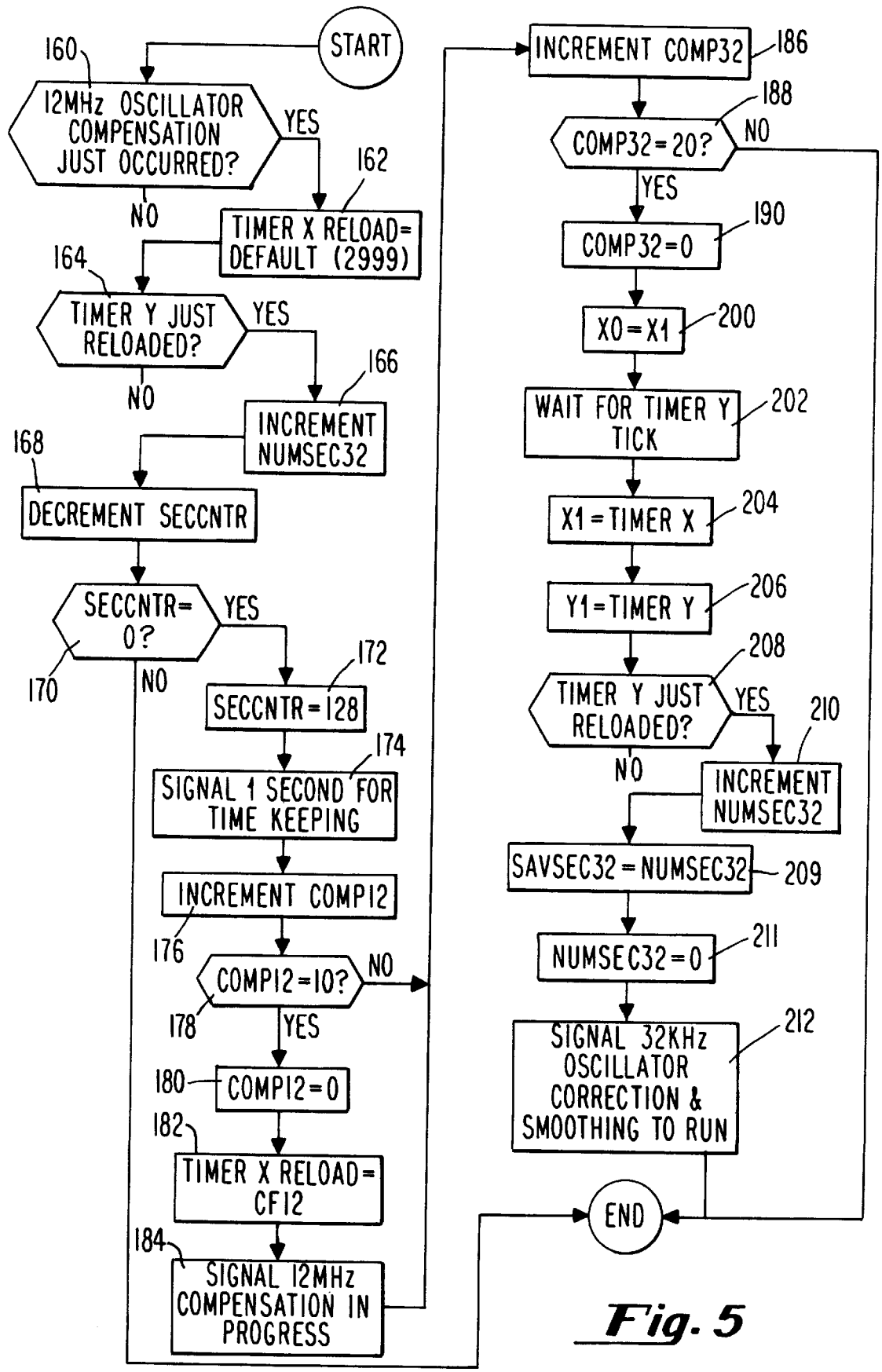
FIG. 5 is a more detailed flow chart of a portion of the programming disclosed in FIG. 3.

The operation of MCU 16 at 122 in FIG. 3 can also be understood in relation to the flow chart shown in FIG. 5. FIG. 5 is a detailed flow chart of 122 in FIG. 3. At 160 a determination is made as to whether a 12 MHz compensation has just occurred. If such compensation has occurred, TIMER X reloads a default value at 162. At 164 a determination is made of whether TIMER Y just reloaded. If TIMER Y has just reloaded, NUMSEC32 is incremented at 166. If TIMER Y has not just reloaded or once NUMSEC32 has been incremented, SECCNTR is decremented at 168.

A determination is made at 170 if the count in SECCNTR is zero. If it is not, a complete second has not yet passed. Accordingly, it is not yet time to perform the boundary routines. If the count in SECCNTR does equal zero, SECCNTR is reset to the value 128 at 172. At 174 a signal is provided indicating that 1 second has passed. COMP12 is incremented at 176 and a determination is made at 178 if the count in COMP12 equals 10. If the count in COMP12 equals 10, COMP12 is reset to zero at 180. TIMER X is then reloaded at 182 with the compensation factor CF12 and a signal is given at 184 that the 12 MHz compensation is in progress. Once the 12 MHz compensation signal is given or if it is determined at 178 that the count in COMP12 does not equal 10 seconds, the count in COMP32 is incremented at 186.

A determination is made at 188 whether COMP32 equals 20. If COMP32 does not equal 20, then it is not yet time to calculate CF32 and the routine ends. If it is determined that COMP32 does equal 20, COMP32 is reset to zero at 190. At 200 the term X0 is made equal to the last determined X1 count. It will be recalled that X0 represents the count of TIMER X at the beginning of the 20 second interval, which is the same as the count at the end of the previous interval. Accordingly, X0 is made equal to the last determined X1. The routine then waits at 202 for the next tick of TIMER Y.

At 204, X1 is made equal to the current value of TIMER X. This value will be the count of TIMER X at the end of the current interval. At 206, Y1 is made equal to the count existing in TIMER Y. A determination is made at 208 if TIMER Y just reloaded. If TIMER Y just reloaded, the count in NUMSEC32 is incremented. At 209 SAVSEC32 is set equal to the current value of NUMSEC32 and at 211 NUMSEC32 is then set equal to zero. At 212, a signal is generated to run the 32 kHz correction factor calculation and smoothing routine.

Consider now the 32 kHz oscillator compensation process beginning at 190 in FIG. 5. In order to calculate a new CF32, MCU 16 must first gather certain information, i.e., take a "snapshot" or get the values of certain timers and counters. To this end, MCU 16 sets COMP32 equal to zero at 190. MCU 16 then sets the term X0 equal to the TIMER X term X1 (200 FIG. 5) from the prior CF32 calculation. It is noted that the count in TIMER X is used in the calculation of CF32 in order to account for the small offset in time that will occur while MCU 16 is cycling through its programming to reach the CF32 calculation routine.

At 202, MCU 16 next determines when TIMER Y has generated its next "tick" or count transition (occurs approximately every 30.5 μs). When MCU 16 makes this determination, it reads the count then existing in TIMER X and saves or stores this count in X1. MCU 16 then reads the count in TIMER Y and saves this count in Y1. MCU 16 then determines if the tick of TIMER Y that it just waited for was the tick that caused TIMER Y to reload. This is achieved by checking to see if the TIMER Y reload flag is set. If that is the case, then MCU 16 increments the count at NUMSEC32 (154). MCU 16 then saves the count in NUMSEC32 in SAVSEC32 and sets NUMSEC32 to zero. The four variables needed to calculate CF32 are now saved in X0, X1, Y1 and SAVSEC32. MCU 16 then sets a flag indicating that a new CF32 is ready to be calculated. Waiting for the next tick of TIMER Y minimizes an error which would otherwise be introduced to the compensation process. Since the next tick of TIMER Y might be the one which causes TIMER Y to reload, the TIMER Y reload flag is checked. It is further noted that this must be a continuous ongoing process in order to be able to use the prior calculation's term X1 as the next calculation's term X0.

Consider now the process which occurs at 122 in FIG. 3. MCU 16 then reads the count in seconds counter 154. Here, MCU 16 calculates the correction factor CF32 to compensate for the inaccuracy in oscillator 32. Using the corrected 12 MHz oscillator as the ideal, MCU 16 counts the number of oscillator ticks within a 20 second interval. The ratio of this value to the ideal is the correction factor. In the preferred embodiment, the correction factor is run through a smoothing function which enables more long term determinations. Such long term determinations tend to smooth out any sudden changes in the correction factor.

In the preferred embodiment, the formula for calculating the 32 kHz correction factor is as follows:

$$CF32 = \frac{32{,}768 * [(X0 - X1) + (20 * 383{,}940)]}{[y + (32{,}768 * SAVSEC32)] * 383{,}940}$$

Where:
CF32=this iteration's correction factor
X0=TIMER X initial sample
X1=TIMER X ending sample
Y=TIMER Y ending sample subtracted from 32768, i.e., 32768−Y1. The subtraction is needed since in the preferred embodiment, TIMER Y is a down counter.

Since equation (1) can yield large values in both numerator and denominator, the following equation is used to preserve resolution:

$$CF32 = \frac{20 * 32{,}768}{(SAVSEC * 32{,}768) + y}$$

In the preferred embodiment the correction factor is calculated by first determining y as y=32768−Y1 and then using $$+ \frac{x0 - x1}{[(y/32{,}768) + SAVSEC32] * 383{,}940}$$

the following:

$$CF32 = (655360/((SAVSEC32 * 32768) + y)) + ((x0-x1)/(((y/32{,}768) + SAVSEC32) * 383940))$$

Using an exponential smoothing filter to apply the iteration's correction factor is preferred. One such smoothing filter is as follows:

$$F1 = CF32 * (1/M) + F0 * ((M-1)/M)$$

where:
F1=new filter correction factor
F0=old filter correction factor
CF32=current iteration correction factor
M=filtering constant.

In the preferred embodiment, M is chosen to be 32. This provides an appropriate time constant and enables the equation to be easily implemented with additions and bit shifts.

TABLE 1

Meter Formulae

Watt formulae $$-3: \text{Watts} = K_G(K_A V_{A_0} I_{A_0} + K_B V_{B_1} I_{B_1} + K_C V_{C_2} I_{C_2})$$

$$-2: \text{Watts} = K_G((K_A V_{A_0} - K_B V_{B_0}) I_{A_0} + (K_C V_{C_2} - K_D V_{B_2}) I_{C_2})$$

$$-8: \text{Watts} = K_G(K_A V_{A_0} I_{A_0} - (K_B V_{A_1} I_{B_1} + K_B V_{C_1} I_{B_1}) + K_C V_{C_2} I_{C_2})$$

$$-7: \text{Watts} = K_G(K_A V_{A_0} I_{A_0} - K_B V_{A_0} I_{B_0} + K_C V_{C_2} I_{C_2})$$

NOTE: Subscripts refer to the phase of the inputs. Subsubscripts refer to the A/D cycle in which the sample is taken. Va for −7 applications is actually line to neutral. p0 VA Formulae $$-3: VA = K_G[(K_A V_{A_0})_{rms} I_{A_0 rms} + (K_B V_{B_1})_{rms} I_{B_1 rms} + (K_C V_{C_2})_{rms} I_{C_2 rms}]$$

$$-2: VA = K_G((K_A V_{A_0} - K_B V_{B\,di\,0})_{rms} I_{A_0 rms} + (K_C V_{C_2} - K_D V_{B_2})_{rms} I_{C_2 rms})$$

$$-8: VA = K_G[K_A V_{A_0 rms} I_{A_0 rms} - K_B(V_{A_1} + V_{C_1})_{rms} I_{B_1 rms} + K_C V_{C_2 rms} I_{C_2 rms}]$$

$$-7: VA = K_G(K_A V_{A_0 rms} I_{A_0 rms} + K_B V_{A_0 rms} I_{B_0 rms} + K_C V_{C_2 rms} I_{C_2 rms})$$

RMS measurements are made over one line cycle and preferably begin at the zero crossing of each voltage.

VAR Formula $$VAR = \sqrt{VA_A^2 - \text{Watt}_A^2} + \sqrt{VA_B^2 - \text{Watt}_B^2} + \sqrt{VA_C^2 - \text{Watt}_C^2}$$

where the subscripts are associated with the I terms of Watts and VAs and the calculation is performed every cycle as shown below:

$$-3: VAR = K_G\left(K_A\sqrt{(V_{A_0\text{rms}}I_{A_0\text{rms}})^2 - \left(\sum_{\text{zero}}^{\text{cycle}} V_{A_0}I_{A_0}\right)^2} + K_B\sqrt{(V_{B_1\text{rms}}I_{B_1\text{rms}})^2 - \left(\sum_{\text{zero}}^{\text{cycle}} V_{B_1}I_{B_1}\right)^2} + K_C\sqrt{(V_{C_2\text{rms}}I_{C_2\text{rms}})^2 - \left(\sum_{\text{zero}}^{\text{cycle}} V_{C_2}I_{C_2}\right)^2}\right)$$

$$-2: VAR = K_G\left(\sqrt{((K_A V_{A_0} - K_B V_{B_0})_{\text{rms}}I_{A_0\text{rms}})^2 - \left(\sum_{\text{zero}}^{\text{cycle}}(K_A V_{A_0} - K_B V_{B_0})I_{A_0}\right)^2} + \sqrt{((K_C V_{C_2} - K_D V_{B_2})_{\text{rms}}I_{C_2\text{rms}})^2 - \left(\sum_{\text{zero}}^{\text{cycle}}(K_C V_{C_2} - K_D V_{B_2})I_{C_2}\right)^2}\right)$$

$$-8: VAR = K_G\left(K_A\sqrt{(V_{A_0\text{rms}}I_{A_0\text{rms}})^2 - \left(\sum_{\text{zero}}^{\text{cycle}} V_{A_0}I_{A_0}\right)^2} + \sqrt{\left(\tfrac{1}{2}(K_B V_{A_0\text{rms}} + K_D V_{C_2\text{rms}})I_{B_0\text{rms}}\right)^2 - \left(\sum_{\text{zero}}^{\text{cycle}}(K_B V_{A_0}I_{B_0} + K_D V_{C_2}I_{B_2})\right)^2} + K_C\sqrt{(V_{C_2\text{rms}}I_{C_2\text{rms}})^2 - \left(\sum_{\text{zero}}^{\text{cycle}} V_{C_2}I_{C_2}\right)^2}\right)$$

$$-7: VAR = K_G\left(K_A\sqrt{(V_{A_0\text{rms}}I_{A_0\text{rms}})^2 - \left(\sum_{\text{zero}}^{\text{cycle}} V_{A_0}I_{A_0}\right)^2} + K_B\sqrt{(V_{A_0\text{rms}}I_{B_0\text{rms}})^2 - \left(\sum_{\text{zero}}^{\text{cycle}} V_{A_0}I_{B_0}\right)^2} + K_C\sqrt{(V_{C_2\text{rms}}I_{C_2\text{rms}})^2 - \left(\sum_{\text{zero}}^{\text{cycle}} V_{C_2}I_{C_2}\right)^2}\right)$$

For purposes of the above formulae, the following definitions apply:
 $-2$ means a 2 element in 3 wire delta application;
 $-3$ means a 3 element in 4 wire wye application;
 $-8$ means a 2½ element in 4 wire wye application;
 $-5$ means a 2 element in 3 wire delta application;
 $-7$ is a 2½ element in 4 wire delta application.

While the invention has been described and illustrated with reference to specific embodiments, those skilled in the art will recognize that modification and variations may be made without departing from the principles of the invention as described herein above and set forth in the following claims.

What is claimed is:

1. An electronic meter for metering electrical energy, comprising:
 a first oscillator for generating a first clock signal to within a first accuracy;
 a second oscillator for generating a second clock signal within a second accuracy; and
 a processor, being operable in relation to a clock signal and connected to receive said first and second clock signals, for measuring time and for periodically compensating for said first accuracy of said first oscillator, wherein said first clock signal is used by said processor for measuring time when power is applied to said meter and wherein said second clock signal is used by said processor for measuring time when power has been removed from said meter.

2. The meter of claim 1, further comprising a memory having a compensation factor stored therein, wherein said processor periodically compensates for said first accuracy using said first compensation factor.

3. The meter of claim 2, wherein said processor comprises a counter for counting from a first value to a second value in response to said first clock signal and wherein said processor substitutes said first compensation factor for said first value.

4. The meter of claim 3, wherein said processor comprises a first timer and wherein said processor substitutes said first compensation factor for said first value in response to said first timer.

5. The meter of claim 4, wherein said first timer is operable to determine time intervals of approximately 10 seconds.

6. The meter of claim 1, wherein said processor implements a process for compensating for said second accuracy of said second oscillator.

7. The meter of claim 6, wherein said processor comprises means for compensating for said second accuracy in relation to said first oscillator.

8. The meter of claim 6, wherein said processor comprises means for calculating a second compensation factor, wherein said second compensation factor is determined when power is applied to said meter, wherein after power has been removed and restored, said second compensation factor is used to compensate time measured in relation to said second oscillator during the period power had been removed.

9. The meter of claim 8, wherein said processor comprises a second timer, wherein the determination of said second compensation factor is made in response to said second timer.

10. The meter of claim 9, wherein said second timer is operable to determine time intervals of approximately 20 seconds.

11. A method for metering electrical energy, comprising the steps of:

generating a first clock signal to within a first accuracy;

generating a second clock signal within a second accuracy; and measuring time and periodically compensating for said first accuracy of said first clock signal, wherein said first clock signal is used for measuring time when power is applied to said meter and wherein said second clock signal is used for measuring time when power has been removed from said meter.

12. The method of claim 11, further comprising the step of providing a first compensation factor and the step of counting from a first value to a second value in response to said first clock signal and substituting said first compensation factor for said first value.

13. The method of claim 11, further comprising the step of compensating for said second accuracy in relation to said first clock signal.

14. The method of claim 13, wherein said step of compensating comprises calculating a second compensation factor, wherein said second compensation factor is determined when power is applied to said meter, wherein after power has been removed and restored, said second compensation factor is used to compensate time measured in relation to said second clock signal during the period power had been removed.

15. An electronic apparatus for monitoring time, said apparatus comprising:

a first oscillator, having a first accuracy, for generating a first clock signal for use by said apparatus during periods of full power applied to said apparatus;

a second oscillator for generating a second clock signal for use by said apparatus during periods of reduced power applied to said apparatus; and a processor, being operable in relation to a clock signal and connected to receive said first and second clock signals, for measuring time and for periodically compensating for said first accuracy of said first oscillator.

* * * * *

UNITED STATES PATENT AND TRADEMARK OFFICE
CERTIFICATE OF CORRECTION

PATENT NO. : 6,005,384              Page 1 of 1
DATED : December 21, 1999
INVENTOR(S) : Rodney C. Hemminger et al.

It is certified that error appears in the above-identified patent and that said Letters Patent is hereby corrected as shown below:

Column 12,
Line 46, delete "p0"
Line 51, should read as follows:

$$-2: VA = K_G((K_A V_{A_0} - K_B V_{B_0})_{rms} I_{A_0 rms} + (K_C V_{C_2} - K_D V_{B_2})_{rms} I_{C_2 rms})$$

Column 13 and 14,
In each equation in the first half of the page, $$\sum_{zero}^{cycle} \text{ should read } -- \sum_{zero}^{cycle} --$$

Signed and Sealed this

Fourteenth Day of August, 2001

*Attest:*

*Attesting Officer*

NICHOLAS P. GODICI
*Acting Director of the United States Patent and Trademark Office*